United States Patent
Chang et al.

(10) Patent No.: US 10,574,274 B2
(45) Date of Patent: Feb. 25, 2020

(54) SYSTEMS AND METHODS FOR DECODING ERROR CORRECTING CODES

(71) Applicant: Nyquist Semiconductor Limited, Grand Cayman (KY)

(72) Inventors: Yuan-mao Chang, Hsinchu (TW); Jie Chen, Milpitas, CA (US); Chung-Li Wang, Fremont, CA (US)

(73) Assignee: Nyquist Semiconductor Limited, Grand Cayman (KY)

( * ) Notice: Subject to any disclaimer, the term of this patent is extended or adjusted under 35 U.S.C. 154(b) by 68 days.

(21) Appl. No.: 15/719,753

(22) Filed: Sep. 29, 2017

(65) Prior Publication Data

US 2019/0103885 A1   Apr. 4, 2019

(51) Int. Cl.
*H03M 13/00*  (2006.01)
*H03M 13/45*  (2006.01)
*H03M 13/37*  (2006.01)
*H03M 13/11*  (2006.01)

(52) U.S. Cl.
CPC ..... *H03M 13/458* (2013.01); *H03M 13/1108* (2013.01); *H03M 13/1111* (2013.01); *H03M 13/3707* (2013.01); *H03M 13/3723* (2013.01); *H03M 13/3746* (2013.01)

(58) Field of Classification Search
None
See application file for complete search history.

(56) References Cited

U.S. PATENT DOCUMENTS

| | | | | |
|---|---|---|---|---|
| 8,281,210 B1 * | 10/2012 | Farjadrad | ............. | H03M 13/112 714/755 |
| 8,291,285 B1 * | 10/2012 | Varnica | ............. | H03M 13/1137 714/752 |
| 8,312,354 B1 * | 11/2012 | Varnica | ............. | H03M 13/1105 714/780 |
| 8,700,973 B1 * | 4/2014 | Varnica | ............. | H03M 13/1142 714/758 |
| 2006/0242536 A1 * | 10/2006 | Yokokawa | ......... | H03M 13/1111 714/758 |
| 2009/0304111 A1 * | 12/2009 | Shinya | ............... | H03M 13/1111 375/316 |
| 2009/0307566 A1 * | 12/2009 | No | ..................... | H03M 13/1105 714/784 |

(Continued)

OTHER PUBLICATIONS

Wolf, Jack Keil, An Introduction to Error Correcting Codes Part 3, pp. 1-41, Spring, 2010.
(Continued)

*Primary Examiner* — Mujtaba M Chaudry
(74) *Attorney, Agent, or Firm* — IPro, PLLC; Xiaomin Huang

(57) ABSTRACT

Systems and methods are provided for decoding a codeword encoded by a linear block code. A method may comprise performing a first decoding on a codeword using a first decoder, determining a number of satisfied check nodes and a number of unsatisfied check nodes for a symbol value of the codeword for a decoding result of the first decoding, generating a soft log-likelihood ratio (LLR) for the symbol value based on the number of satisfied check nodes and the number of unsatisfied check nodes, and performing a second decoding using a second decoder with the soft LLR as an input to the second decoder.

18 Claims, 8 Drawing Sheets

(56) References Cited

U.S. PATENT DOCUMENTS

| | | | | |
|---|---|---|---|---|
| 2010/0088575 A1* | 4/2010 | Sharon | ................ | G06F 11/1072 |
| | | | | 714/763 |
| 2013/0173985 A1* | 7/2013 | Chung | ................ | G06F 11/1012 |
| | | | | 714/755 |
| 2015/0286523 A1* | 10/2015 | Cai | .................... | G11B 20/1833 |
| | | | | 714/807 |
| 2015/0349807 A1* | 12/2015 | Vernon | ............... | H03M 13/353 |
| | | | | 714/774 |
| 2015/0381206 A1* | 12/2015 | Fainzilber | .......... | H03M 13/1108 |
| | | | | 714/758 |
| 2016/0020783 A1* | 1/2016 | Yang | .................... | H03M 13/114 |
| | | | | 360/53 |
| 2017/0085276 A1* | 3/2017 | Prabhakar | .......... | H03M 13/1111 |

OTHER PUBLICATIONS

Siegel, Paul H., An Introduction to Low-Density Parity-Check Codes, Electrical and Computer Engineering University of California, San Diego, Center for Wireless Communications and Center for Magnetic Recording Research, San Diego, California, pp. 1-68, May 31, 2007.

Leiner, Bernhard M.J., LDPC Codes—a brief Tutorial, Apr. 8, 2005, pp. 1-9.

* cited by examiner

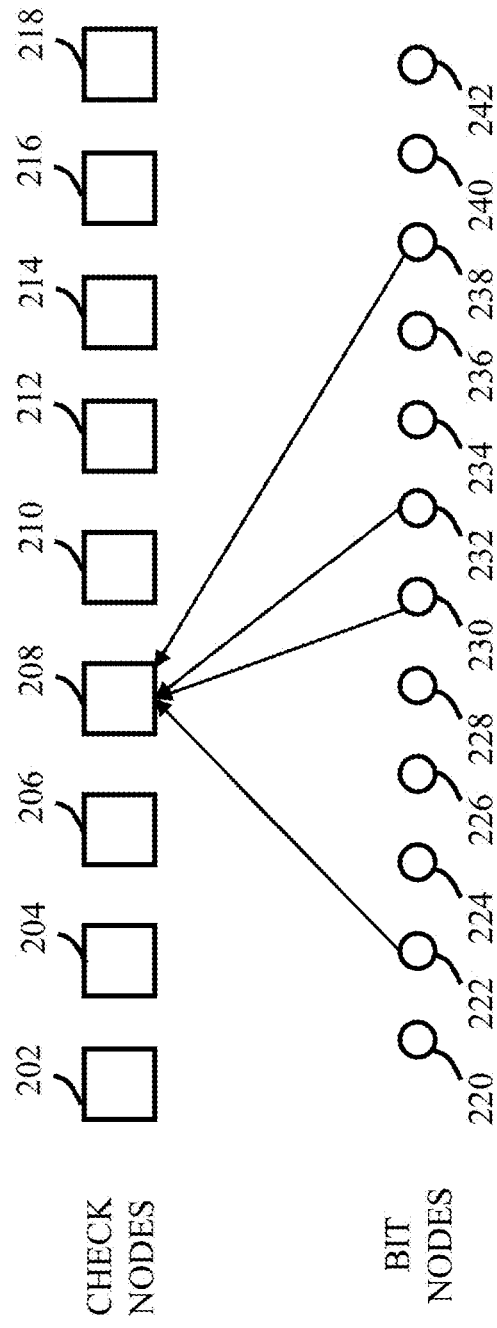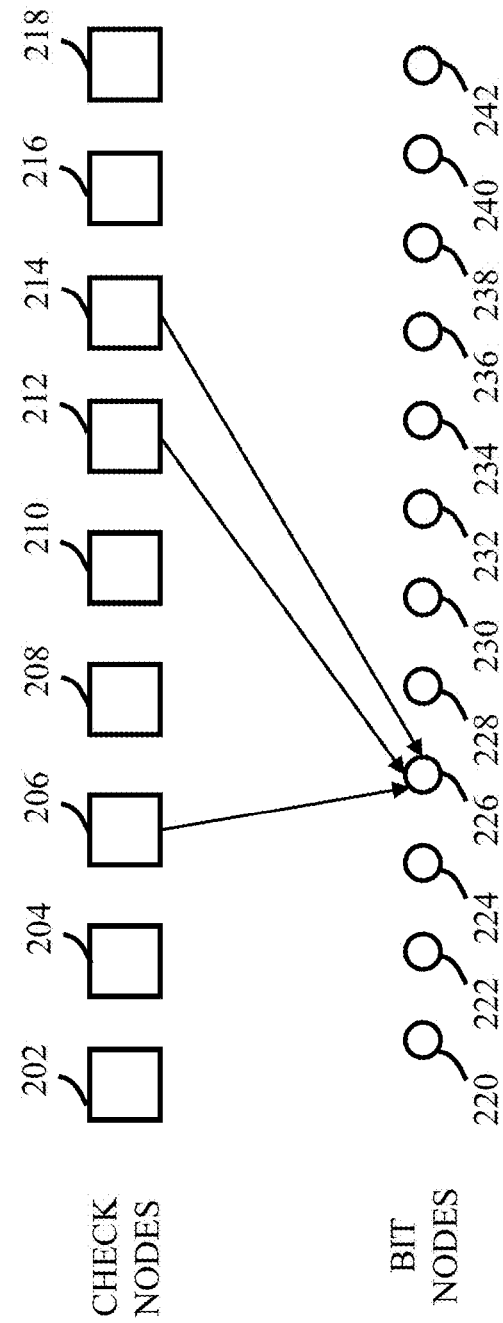

SYSTEMS AND METHODS FOR DECODING ERROR CORRECTING CODES

TECHNICAL FIELD

The disclosure herein relates to decoding codewords encoded with parity check data, particularly relates to decoding codewords using soft log-likelihood ratios (LLRs) generated based on a decoding result.

BACKGROUND

One issue common to many data communication or storage systems is the corruption of data, for example, by noise in a communication channel or write/read processes in a storage system. One technique to remedy the data corruption is to use an error-correcting code (ECC) or forward error correction (FEC) code. ECC and FEC add redundant data or parity data to user data such that user data can be recovered by a receiver or reader even when a number of errors (up to the capability of the code being used) were introduced, for example, during the process of transmission or corruption on a storage.

A lot of different coding schemes have been developed over the years, for example, Hamming codes, Reed-Solomon codes, Turbo codes, etc. More recently, low density parity check (LDPC) codes have become widely used. All these codes, however, are computation complex and still in need of improvements.

SUMMARY

Disclosed herein is a method, comprising: performing a first decoding on a codeword using a first decoder; determining, for a symbol value of the codeword, a number of satisfied check nodes and a number of unsatisfied check nodes for a decoding result of the first decoding; generating a soft log-likelihood ratio (LLR) for the symbol value based on the number of satisfied check nodes and the number of unsatisfied check nodes; and performing a second decoding using a second decoder with the soft LLR as an input to the second decoder.

According to an embodiment, the first decoding is a hard decision decoding.

According to an embodiment, the second decoding is a soft decision decoding.

According to an embodiment, the soft LLR for the symbol value is generated based on a difference between the number of satisfied check nodes and the number of unsatisfied check nodes.

According to an embodiment, the soft LLR for the symbol value is generated according to an equation $P=((\#S-\#U)*Q+1)*D*X$, in which $\#S$ is the number of satisfied check nodes, $\#U$ is the number of unsatisfied check nodes, Q is a scaling factor, D is the symbol value, X is an original LLR magnitude assigned to the symbol value and "*" is a multiplication sign.

According to an embodiment, the scaling factor Q and the original LLR magnitude X are selected to satisfy a hardware constraint.

According to an embodiment, the first decoding is an iterative decoding.

According to an embodiment, the soft LLR is generated after a configurable number of iteration(s) of the first decoding.

According to an embodiment, the configurable number is any number between one and a maximum number for iterations.

According to an embodiment, the soft LLR is generated after each iteration of the first decoding.

According to an embodiment, the soft LLR used as the input to the second decoding is the soft LLR generated after any iteration.

According to an embodiment, the method further comprises adjusting a bit flip threshold during the first decoding operation.

Disclosed herein is a system comprising a first decoder comprising circuitry configured to perform a first decoding on a codeword; a soft log-likelihood ratio (LLR) generator comprising circuitry configured to: determine, for a symbol value of the codeword, a number of satisfied check nodes and a number of unsatisfied check nodes for a decoding result of the first decoding; and generate a soft log-likelihood ratio (LLR) for the symbol value based on the number of satisfied check nodes and the number of unsatisfied check nodes; and a second decoder comprising circuitry configured to perform a second decoding using the soft LLR as an input.

According to an embodiment, the first decoder is a hard decision decoder and the second decoder is a soft decision decoder.

According to an embodiment, the soft LLR for the symbol value is generated based on a difference between the number of satisfied check nodes and the number of unsatisfied check nodes.

According to an embodiment, the soft LLR generator is configured to generate the soft LLR according to an equation $P=((\#S-\#U)*Q+1)*D*X$, in which $\#S$ is the number of satisfied check nodes, $\#U$ is the number of unsatisfied check nodes, Q is a scaling factor, D is the symbol value, X is an original LLR magnitude assigned to the symbol value and "*" is a multiplication sign.

According to an embodiment, the scaling factor Q and the original LLR magnitude X are selected to satisfy a hardware constraint.

According to an embodiment, the first decoder is configured to perform an iterative decoding and the soft LLR is generated after a configurable number of iteration(s) of the first decoding, and the configurable number is any number between one and a maximum number for iterations.

According to an embodiment, the system further comprises a data storage, wherein the codeword is retrieved from the data storage.

According to an embodiment, the system further comprises a receiver and a demodulator, wherein the codeword is received from a communication channel via the receiver and demodulated by the demodulator.

BRIEF DESCRIPTION OF FIGURES

FIGS. 2B, and 2C are graphical illustrations of information passing in a Tanner graph for a codeword, in accordance with an embodiment of the present disclosure.

DETAILED DESCRIPTION

Figure 1:
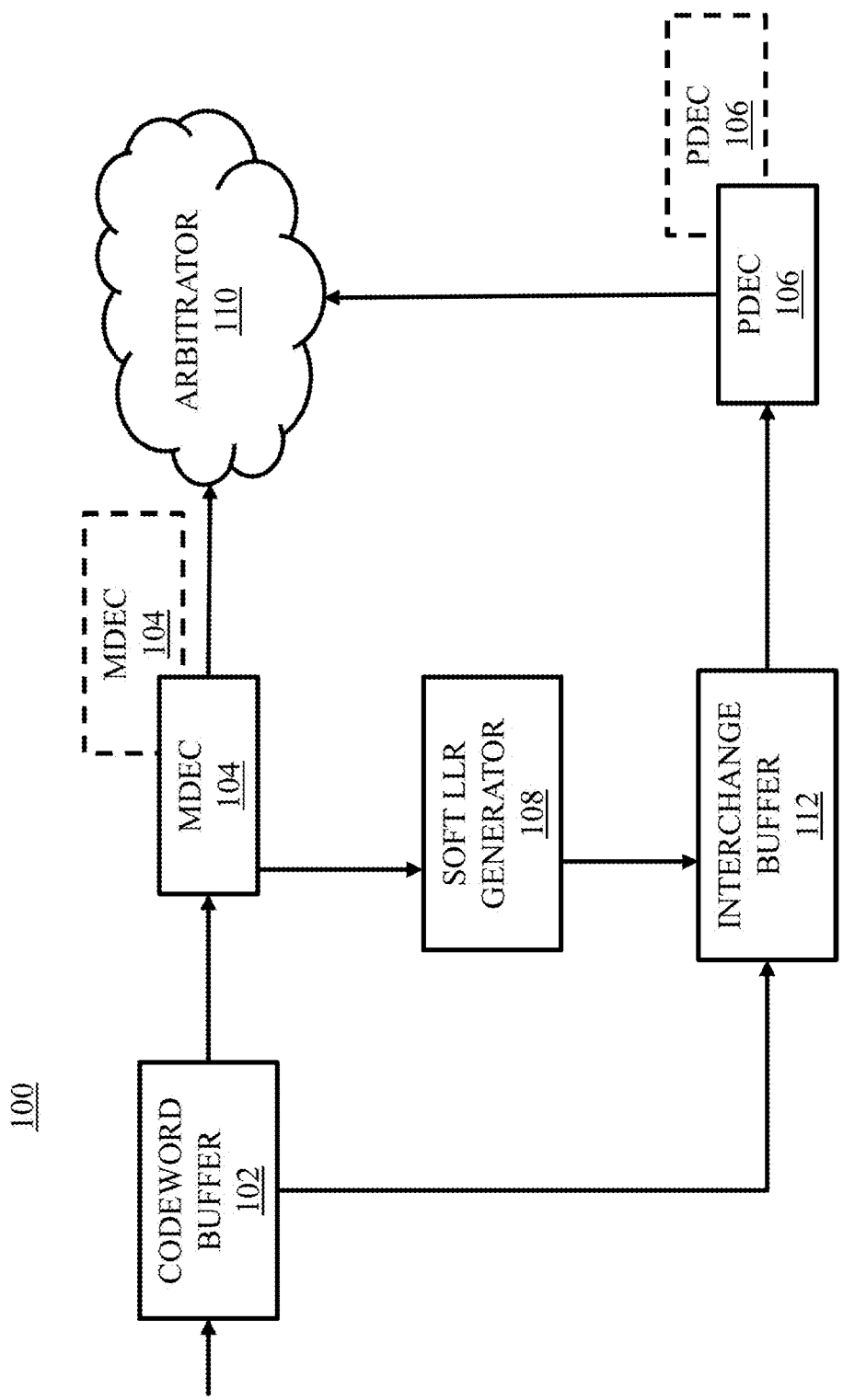
FIG. 1 schematically shows a linear block decoder in accordance with an embodiment of the present disclosure.

Specific embodiments according to the present disclosure will now be described in detail with reference to the accompanying figures. Like elements in the various figures are denoted by like reference numerals for consistency.

The present disclosure provides systems and methods for decoding linear block codes, such as, but not limited to, rectangular parity, the Hamming code, and the low-density parity check (LDPC) code. A linear block code may be specified by a m by n matrix H, where n is the number of bits in a codeword and m is the number of redundancy bits (e.g., parity bits). For an LDPC code, the matrix H may be a sparse matrix that has a low density of non-zero elements. An n-bit codeword c=[c1, c2, c3, ... , cn] is a valid codeword when it satisfies the matrix equation of $Hc^T=0$, where $c^T$ is the transpose of c and the vector $\vec{s}^t = Hc^T$ may be referred to as the syndrome of c. Linear block codes may also be represented in graphical form by a Tanner graph. The Tanner graph corresponding to the m by n matrix H may consist of two sets of vertices: n vertices for the codeword bits (bit nodes), and m vertices for the parity-check equations (check nodes). One or more embodiments according to the present disclosure provide an approach for linear block decoding that comprises performing a first decoding on a codeword, determining the numbers of satisfied check nodes and unsatisfied check nodes for a bit node, generating a soft log-likelihood ratio (LLR) for the bit node based on the satisfied and unsatisfied check nodes, and performing a second decoding using the soft LLR as an input.

FIG. 1A schematically shows a linear block decoder 100, according to an embodiment. The linear block decoder 100 may be a composite or concatenated decoder that comprises a first decoder 104 and a second decoder 106. In addition, the linear block decoder 100 may further comprise a codeword buffer 102, a soft LLR generator 108, an arbitrator 110 and an interchange buffer 112. The codeword buffer 102 may be a temporary storage for codewords. The codewords may be received from, for example, a communication channel, or a storage (such as a memory or hard drive). The codewords may comprise valid codewords, each of which may have a syndrome of zero. That is, they satisfy the matrix equation of $Hc^T=0$. Many codewords in the codeword buffer 102, however, may be invalid. That is, these codewords do not satisfy the matrix equation of $Hc^T=0$ and need to be decoded into valid codewords. In one embodiment, the linear block decoder 100 may be an LDPC decoder.

The first decoder 104 may be a first decoder to be applied to a codeword stored in the codeword buffer 102. The first decoder 104 may receive a codeword from the codeword buffer 102 and determine whether the codeword's syndrome is zero. If the codeword's syndrome is zero, the codeword does not need to be decoded and may be sent to the arbitrator 110. The arbitrator 110 may output the codeword from the linear block decoder 100. If the codeword's syndrome is not zero, the codeword needs to be decoded. The first decoder 104 may perform a first decoding operation. The first decoding operation may be a hard decision decoding operation, which may be, for example, an iterative decoding operation, such as, but not limited to, bit-flipping algorithm known in the industry, or any other techniques yet to be developed. If the first decoding operation successfully decodes the codeword, the decoded codeword may be sent to the arbitrator 110 and the arbitrator 110 may output the decoded codeword from the linear block decoder 100. If, however, the first decoder 104 cannot successfully decode the codeword, data generated during the decoding process may be sent to the soft LLR generator 108.

In one embodiment, the first decoder 104 may be set with a pre-configured maximum number of iterations and the first decoder 104 may perform decoding operation for the pre-configured maximum number of iterations before determining that it cannot successfully decode a codeword. In another embodiment, the first decoder 104 may have convergence determination mechanism. For example, after each iteration, the first decoder 104 may determine whether there is any improvement in the codeword, such as, more check nodes become satisfied. If there is no improvement after an iteration or a configurable number of iterations, the first decoder 104 may determine it cannot successfully decode a codeword and the leave the codeword to be decoded by the second decoder 106.

The soft LLR generator 108 may be configured to generate soft log-likelihood ratio (LLR) based on decoding operation of the first decoder 104. In one embodiment, for example, after each iteration of decoding operation, for a bit node, a number of check nodes of a codeword may be satisfied and a number of check nodes of the codeword may be unsatisfied. The soft LLR generator 108 may generate a soft LLR for a bit node based on the number of satisfied check node(s) and unsatisfied check node(s). The generated LLR information may be sent to the interchange buffer 112, which may also receive the codeword from the codeword buffer 102 and supply both the LLR information and the codeword to the second decoder 106.

In one embodiment, the interchange buffer 112 may receive a processed codeword from the first decoder 104. For example, although the first decoder 104 cannot successfully decode a codeword, one or more symbol values of the codeword may be flipped after each iteration performed. The codeword with one or more symbol values flipped after the first iteration may be temporarily stored as a processed codeword after first iteration, the codeword with one or more symbol values flipped after the second iteration may be temporarily stored as a processed codeword after second iteration, and so forth. Although the soft LLR generator 108 may be shown in FIG. 1 as a component separate from the first decoder 104, in one embodiment, the soft LLR generator 108 may be implemented as part of the first decoder 104.

The second decoder 106 may be a second decoder to be applied to a codeword if the first decoder 104 fails to successfully decode the codeword. The second decoder 106 may perform a second decoding operation that may use the generated LLR information for a bit node of the codeword. The second decoding operation may be an implementation of a soft decision decoding based on belief propagation known in the industry or any soft decision algorithms yet to be developed. For example, in one embodiment, the second decoding operation may be a message passing algorithm (MPA) already known in the industry or yet to be developed, such as, but not limited to, sum-product algorithm ("SPA"), min-sum algorithm, stochastic decoding algorithm, or their variations. When the second decoder 106 successfully decode a codeword, the second decoder 106 may send the decoded codeword to the arbitrator 110 and the arbitrator 110 may output the decoded codeword from the linear block decoder 100.

In one embodiment, the first decoder 104 may be referred to as a main decoder ("MDEC") and the second decoder 106 may be referred to as a powerful decoder ("PDEC"). Moreover, in one embodiment, the linear block decoder 100 may comprise a plurality of first decoders 104 (e.g., two, three, four, eight, sixteen, etc.). As an example, a second first decoder 104 is shown in phantom. The plurality of first decoders 104 may perform first decoding in parallel on different codewords from the codeword buffer 102. In addition, in one embodiment, the linear block decoder 100 may comprise a plurality of second decoders 106 (e.g., two, three, four, eight, sixteen, etc.). As an example, a second second decoder 106 is shown in phantom. The plurality of second decoders 106 may perform second decoding in parallel on different codewords not successfully decoded by the first decoders 104.

Figure 2A:
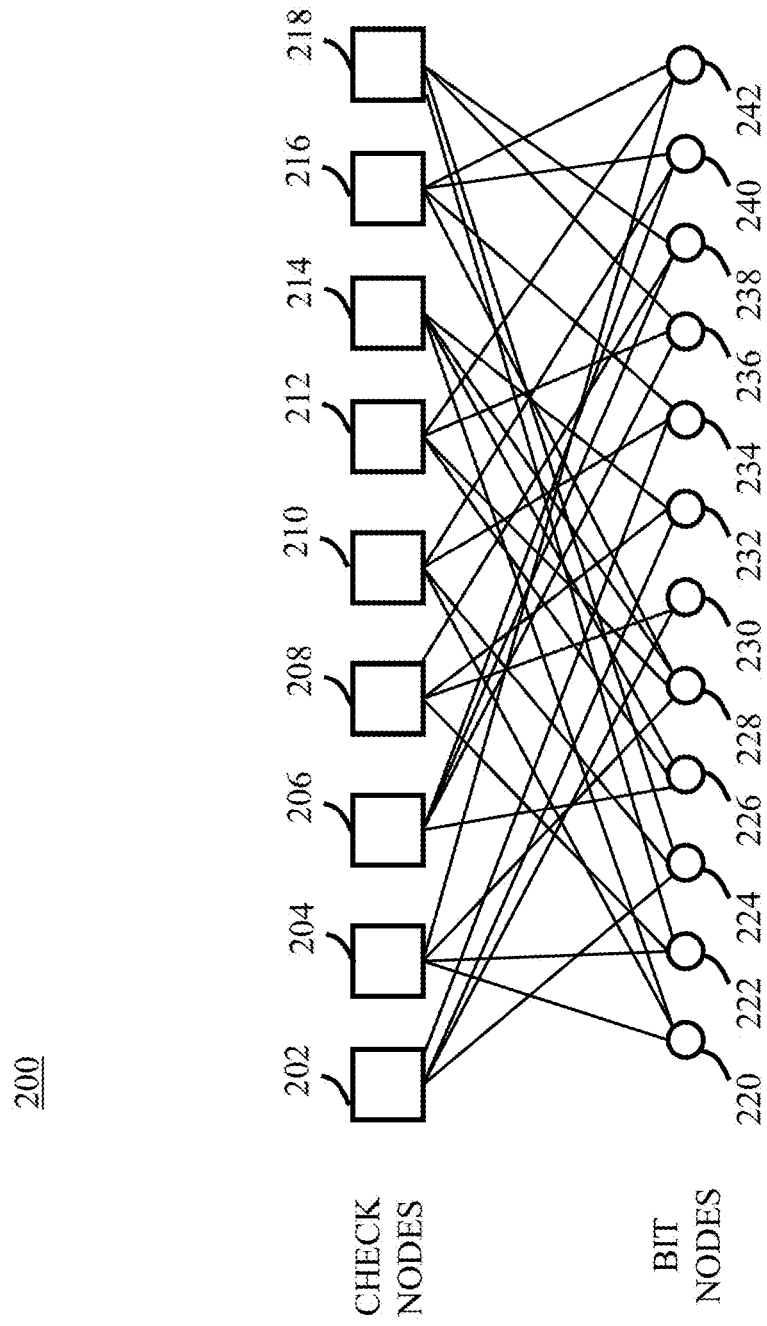
FIG. 2A is a graphical illustration of a Tanner graph for a codeword, in accordance with an embodiment of the present disclosure.

FIG. 2A is a graphical illustration of a Tanner graph 200 for a codeword, in accordance with an embodiment of the present disclosure. The Tanner graph 200 may be a bipartite graph that illustrates the parity check constraints for a block code such as a Hamming code or an LDPC code. The parity check constraints may be specified in a parity check matrix HE. For an LDPC code, the parity check matrix HE may be a low-density, sparse n by m matrix, in which n may be the number of symbols in a codeword and m is the number of check nodes. The parity check matrix HE is not necessarily unique, and may be chosen by any known techniques or any techniques to be developed in the future.

Each row of the parity check matrix HE may correspond to one of the check nodes and each column may correspond to one of the bit nodes. In a binary code, the elements of the parity check matrix are 0 or 1, but for a non-binary LDPC code, the elements of the parity check matrix may have non-binary values. Each row of the parity check matrix may form the coefficients of a parity check equation. For example, for the nodes pictured in FIG. 2A, the parity check matrix HE may be as follows:

$$\begin{matrix} 0 & 0 & 1 & 0 & 0 & 1 & 1 & 1 & 0 & 0 & 0 & 0 \\ 1 & 1 & 0 & 0 & 1 & 0 & 0 & 0 & 0 & 0 & 0 & 1 \\ 0 & 0 & 0 & 1 & 0 & 0 & 0 & 0 & 1 & 1 & 1 & 0 \\ 0 & 1 & 0 & 0 & 0 & 1 & 1 & 0 & 0 & 1 & 0 & 0 \\ 1 & 0 & 1 & 0 & 0 & 0 & 0 & 1 & 0 & 0 & 1 & 0 \\ 0 & 0 & 0 & 1 & 1 & 0 & 0 & 0 & 1 & 0 & 0 & 1 \\ 1 & 0 & 0 & 1 & 1 & 0 & 1 & 0 & 0 & 0 & 0 & 0 \\ 0 & 0 & 0 & 0 & 0 & 1 & 0 & 1 & 0 & 0 & 1 & 1 \\ 0 & 1 & 1 & 0 & 0 & 0 & 0 & 0 & 1 & 1 & 0 & 0 \\ 0 & 1 & 1 & 0 & 0 & 0 & 0 & 0 & 1 & 1 & 0 & 0 \end{matrix}$$

There are two types of nodes shown in a Tanner graph. As shown in FIG. 2A, the check nodes 202, 204, 206, 208, 210, 212, 214, 216 and 218 may be denoted by squares and may represent parity check equations that a valid codeword or successfully decoded codeword must satisfy. The bit nodes 220, 222, 224, 226, 228, 230, 232, 234, 236, 238, 240 and 242 may be denoted as circles and may represent symbols (i.e., bits for a binary code) in a codeword, for example, the bit nodes 220, 222, 224, 226, 228, 230, 232, 234, 236, 238, 240 and 242 may represent c1, c2, c3, c4, c5, c6, c7, c8, c9, c10, c11 and c12 in a codeword c=[c1, c2, c3, c4, c5, c6, c7, c8, c9, c10, c11, c12] respectively.

The connections between the check nodes and the bit nodes may represent parity check constraints. For example, the check node 202 may represent the first row of parity check equation specified in the parity check matrix HE shown above, which has non-zero values in columns 3, 6, 7 and 8. The symbols c3, c6, c7 and c8 in a codeword may correspond to these non-zero positions in the first row of the parity check matrix HE and the first row of parity check equation may be represented by the mathematic equation: c3 ⊕ c6 ⊕ c7 ⊕ c8=0, where ⊕ is modulo-2 addition for binary codewords. Because the bit nodes 224, 230, 232 and 234 correspond to the symbols c3, c6, c7 and c8, the check node 202 may be connected to these bit nodes. That is, the check node 202 may be considered to "check" the bit nodes 224, 230, 232 and 234. Similarly, the check node 204 may represent the second row of parity check equations specified in the parity check matrix HE shown above, which has non-zero values in columns 1, 2, 5 and 12, and the second row of parity check equation may be represented by the mathematic equation: c1 ⊕ c2 ⊕ c5 ⊕ c12=0, where ⊕ is modulo-2 addition for binary codewords. Because the bit nodes 220, 222, 228 and 242 may correspond to the symbols c1, c2, c5 and c12, the check node 204 may be connected to these bit nodes. The check node 204 may be considered to "check" the bit nodes 220, 222, 228 and 242. The other check nodes may be connected to the bit nodes according to respective parity check constraints. It should be noted that because each row has four non-zero positions, each check node may be connected to four bit nodes.

From the bit nodes perspective, each column in the parity check matrix HE shown above may be non-zero in three rows. That is, each symbol in a codeword may be "checked" by three parity check equations. Accordingly, each bit node may be connected to three check nodes. For example, the first symbol in a codeword may be checked in the second, fifth and seventh parity check equations (the second, fifth and seventh rows of the matrix HE). The bit node 220, which may represent the first symbol in a codeword, may be connected to the check nodes 204, 210 and 214. The bit node 222, which may represent the second symbol in a codeword, may be connected to the check nodes 204, 208 and 218. The other bit nodes may be connected to the check nodes according to respective parity check constraints. The overall connections from the bit nodes' perspective are the same as that from the check nodes' perspective.

FIGS. 2B, and 2C are graphical illustrations of information passing in the Tanner graph 200 for a codeword, in accordance with an embodiment of the present disclosure. The Tanner graph 200 may be used for an iterative decoding of a codeword. As shown in FIG. 1A, the check node 208 may be connected to the bit nodes 222, 230, 232 and 238. That is, the check node 208 may "check" the bit nodes 222, 230, 232 and 238. For illustration, the arrows in FIG. 2B indicate that information may flow from the bit nodes 222, 230, 232 and 238 to the check node 208. The check node 208 may perform an operation to "check" the bit nodes 222, 230, 232 and 238 based on the information passed from these bit nodes. This may be referred to as a symbol-to-check step in an iterative decoding operation. The check nodes may perform the "check" operation according to the decoding algorithm implemented by a decoder (e.g., a hard decision algorithm, or a soft decision decoding algorithm).

In one embodiment, the information passed from the bit nodes to the check nodes may include symbol values of each bit node. For binary symbol values, for example, a modulo-2 sum of the input symbol values may be performed and whether the modulo-2 sum is zero may be determined. If the modulo-2 sum is zero, the check node may be marked as a satisfied check node. If the modulo-2 sum is non-zero, the check node may be marked as an unsatisfied check node. In another embodiment, in addition to symbol values of the bit nodes, reliability information for each symbol value, such as LLR, may be passed from the bit nodes to the check nodes. In this embodiment, in addition to determine whether a check node is satisfied or unsatisfied, a decoder may also determine how reliable (or how confidence) whether a check node is satisfied or unsatisfied.

Moreover, the Tanner graph 200 in FIG. 1A illustrates that the bit node 226 may be connected to the check nodes 206, 212 and 214. That is, the bit node 226 may be "checked" by the check nodes 206, 212 and 214. The arrows in FIG. 2C indicate that information may flow from the check nodes 206, 212 and 214 to the bit node 226. The bit node 226 may perform an operation to update its information (e.g., symbol value, reliability of the symbol value) based on the information from the check nodes 206, 212 and 214. This may be referred to as a check-to-symbol step in an iterative decoding operation.

In one embodiment, the information passed from the check nodes to the bit nodes may include the numbers of satisfied check nodes and unsatisfied check nodes for a bit node. The bit nodes may use this information to determine whether their respective symbol values need to be changed. For example, if the symbol values are binary, a bit node may flip its symbol value if more satisfied check nodes are connected to it than unsatisfied check nodes. In another embodiment, in addition to the numbers of satisfied check nodes and unsatisfied check nodes for a bit node, reliability information of how satisfied or unsatisfied for a check node may also be passed from the check nodes to the bit nodes. In this embodiment, a decoder may determine whether to update the symbol value of a bit node not only based on the numbers of satisfied and unsatisfied check nodes but also how reliable each check node is satisfied or unsatisfied.

Figure 3:
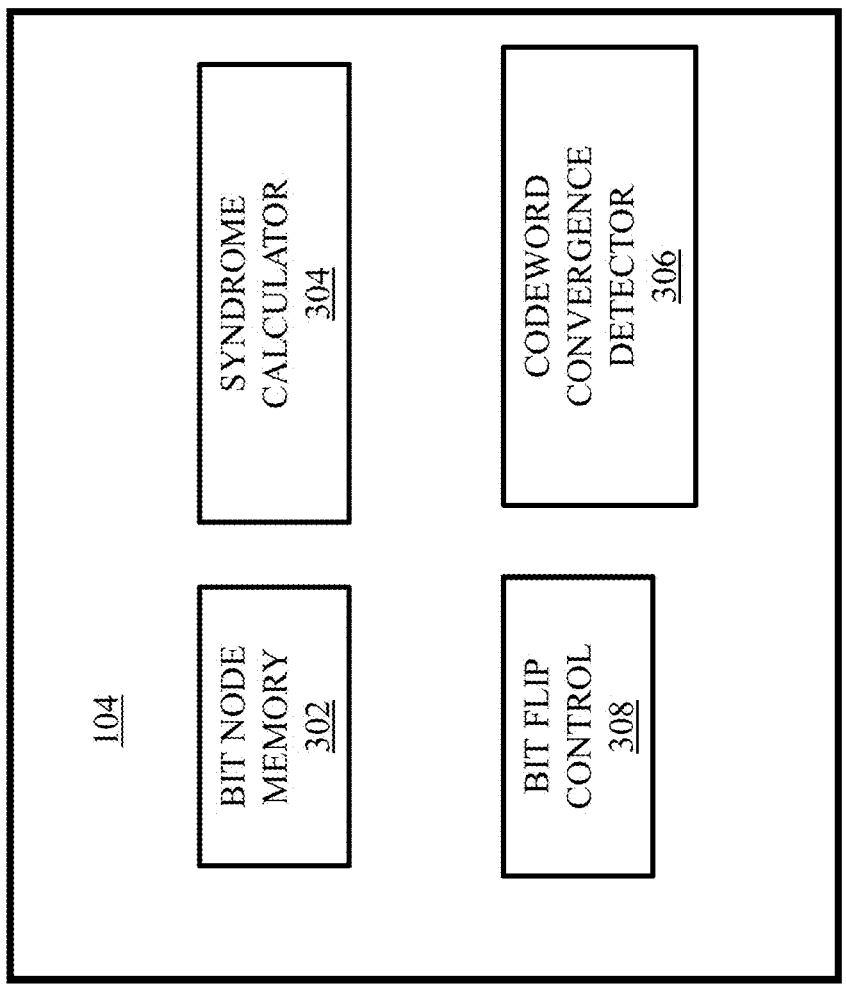
FIG. 3 schematically shows a first decoder of the linear block decoder of FIG. 1, in accordance with an embodiment of the present disclosure.

FIG. 3 schematically illustrates a component diagram of a first decoder 104, according to an embodiment. The first decoder 104 may comprise a bit node memory 302, a syndrome calculator 304, a codeword convergence detector 306 and a bit flip control 308. The bit node memory 302 may be a storage for symbol values of codewords. Before a first iteration of a decoding operation, the symbol values for a codeword in the bit node memory 302 may be the original symbol values from the codeword buffer 102. After each iteration, if the codeword does not satisfy any parity check constraints, one or more symbol values for the codeword being decoded may be changed and the symbol values for the codeword stored in the bit node memory 302 may be updated to reflect the changes.

The syndrome calculator 304 may be configured to calculate the syndrome of the codeword being decoded. For example, the syndrome calculation may include calculation of each parity check equations for a codeword. The codeword convergence detector 306 may configured to determine whether the codeword being decoded is a valid codeword based on the syndrome calculation. If the calculated syndrome for a codeword is zero, the codeword is a valid codeword and may be sent by the first decoder 104 to the arbitrator 110. If the calculated syndrome for a codeword is non-zero, the codeword is invalid. The invalid codeword may be decoded by the first decoder 104 in another iteration, or if a maximum number of iteration has been reached, the first decoder 104 may pass the check nodes satisfaction information to the LLR generator 108 and leave the codeword to be decoded by the second decoder 106.

The bit flip control 308 may comprise a bit flip threshold and may be configured to determine whether a symbol value in the codeword being decoded needs to be updated. In one embodiment, the bit flip threshold may implement a simple majority rule. For example, a bit node may be connected to a total number of T check nodes, and $T = \#U + \#S$, in which $\#U$ may represent the number of unsatisfied check nodes and $\#S$ may represent the number of satisfied check nodes. According to the simple majority rule, as long as the number of unsatisfied check nodes is larger than the number of satisfied check nodes (e.g., $\#U > \#S$), the symbol value of the bit node may be flipped in response to receiving the $\#U$ and $\#S$ information. In another embodiment, the bit flip threshold may be configured to require more than a simple majority. For example, the bit flip threshold may be that the number of unsatisfied check nodes is larger than a sum of the number of satisfied check and a number M, represented by an equation $\#U > \#S + M$. The number M may be a positive integer (e.g., 1, 2, 3, 5, 10, etc.), a percentage of the total number of T (e.g., 10% of T, 15% of T, 30% of T), a percentage of the number of unsatisfied check nodes (e.g., 10% of $\#U$, 15% of $\#U$, 30% of $\#U$) or a percentage of the total number of satisfied check nodes (e.g., 10% of $\#S$, 15% of $\#S$, 30% of $\#S$).

In one or more embodiments, the bit flip threshold may be configurable. For example, it may be set to one threshold to decode one set of codewords and set to another threshold to decode another set of codewords. Moreover, the bit flip threshold may be adjustable during a decoding operation. For example, it may be set to one threshold for one iteration of decoding operation and adjusted to another threshold for another iteration of decoding operation.

Figure 4:
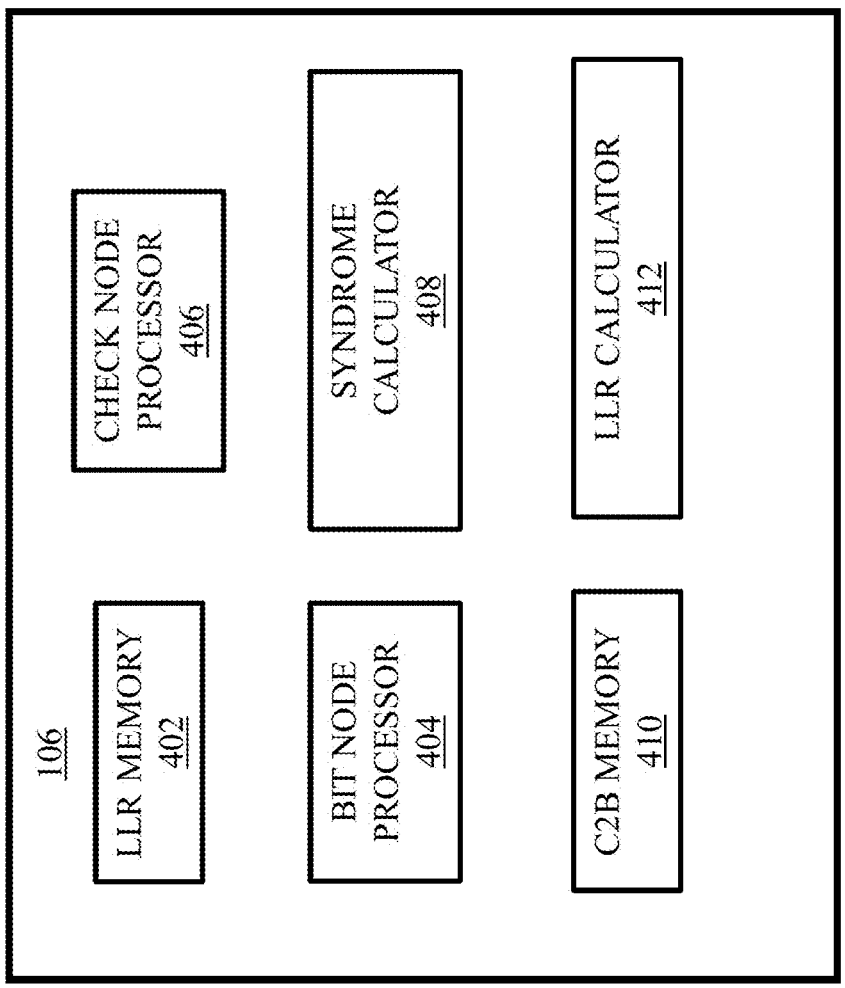
FIG. 4 schematically shows a second decoder of the linear block decoder of FIG. 1, in accordance with an embodiment of the present disclosure.

FIG. 4 schematically illustrates a component diagram of a second decoder 106, according to an embodiment. The second decoder 106 may comprise an LLR memory 402, a bit node processor 404, a check node processor 406, a syndrome calculator 408, a check-to-bit (C2B) memory 410 and an LLR calculator 412. The LLR memory 402 may be a storage for LLR information. Initially, the LLR memory 402 may store the LLR information received from the LLR generator 108. After each decoding iteration by the second decoder 106, the LLR memory 402 may store the updated LLR information generated by the LLR calculator 412.

The bit node processor 404 may be configured to perform operations based on the decoding algorithm implemented by the second decoder 106. In one embodiment, the second decoder 106 may implement a min-sum decoding algorithm and the bit node processor 404 may be configured to perform the bit nodes operations to be performed in the min-sum decoding algorithm. In another embodiment, the second decoder 106 may implement a stochastic decoding algorithm and the bit node processor 404 may be configured to perform the bit nodes operations to be performed in the stochastic decoding algorithm.

The check node processor 406 may also be configured to perform operations based on the decoding algorithm implemented by the second decoder 106. In an embodiment that the second decoder 106 implements a min-sum decoding algorithm, the check node processor 406 may be configured to perform the check nodes operations to be performed in the min-sum decoding algorithm. In another embodiment that the second decoder 106 implements a stochastic decoding algorithm, the check node processor 406 may be configured to perform the check nodes operations to be performed in the stochastic decoding algorithm.

The check-to-bit (C2B) memory 410 may be a storage for information that need to be passed from the check node processor 406 to the bit node processor 404. For example, based on the decoding algorithm implemented by the second decoder 106, the information stored in the C2B memory 410 may be the least reliable LLR and its position (e.g., corresponding to which bit node), the second to least reliable LLR and its position (e.g., corresponding to which bit node), and accumulated symbol values of bit nodes connected to a corresponding check node.

The syndrome calculator 408 may be configured to calculate the syndrome of the codeword being decoded. For example, the syndrome calculation may be calculation of each parity check equations for a codeword. If the calculation result syndrome for a codeword being decoded is zero, the codeword has been successfully codeword and may be sent by the second decoder 106 to the arbitrator 110. If the calculation result syndrome for a codeword being decoded is non-zero, the codeword has not been successfully decoded yet and another iteration may be performed by the second decoder 106.

The LLR calculator 412 may be configured to calculate soft log-likelihood ratio (LLR) based on decoding operation of the second decoder 106. In one embodiment, for example, the second decoder 106 may implement a min-sum decoding algorithm and the LLR calculator 412 may be configured to perform LLR calculations according to the min-sum decoding algorithm. In another embodiment, the second decoder 106 may implement a stochastic decoding algorithm and the LLR calculator 412 may be configured to perform LLR calculations according to the stochastic decoding algorithm. In one or more embodiments, the calculated LLR information may be passed to the LLR memory 402 for the next iteration of decoding operation.

Figure 5:
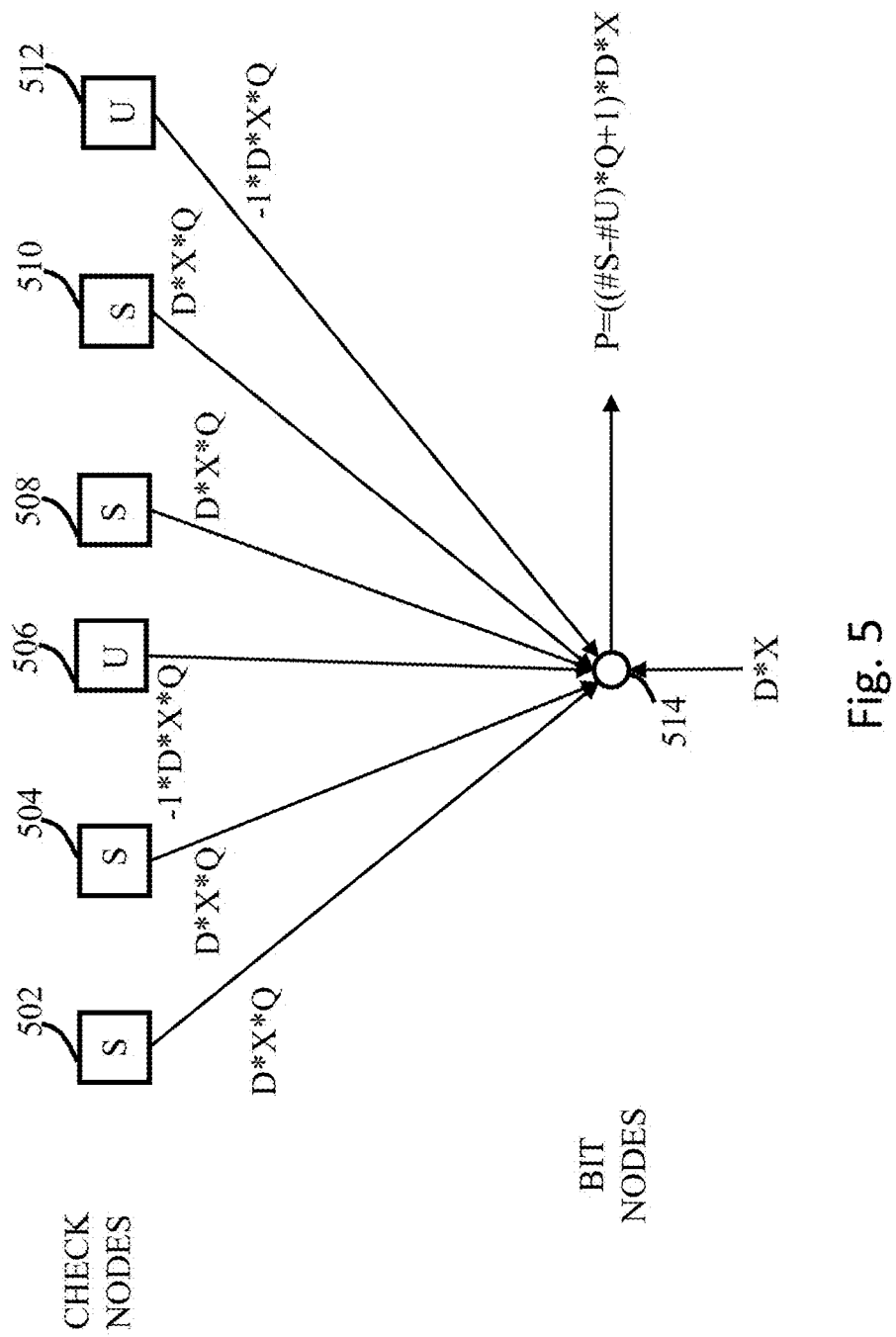
FIG. 5 schematically shows LLR generation, in accordance with an embodiment of the present disclosure.

FIG. 5 schematically illustrates LLR generation in accordance with an embodiment of the present disclosure. The Tanner graph in FIG. 5 may be a partial Tanner graph for a parity check matrix in which each bit node may be "checked" by six check nodes. For example, as shown in FIG. 5, a bit node 514 may be connected to six check nodes 502, 504, 506, 508, 510 and 512. After a symbol-to-check step in one decoding iteration, the check nodes 502, 504, 508 and 510 may be satisfied, and the check nodes 506 and 512 may be unsatisfied, a soft LLR may be generated based on the number of satisfied check nodes (e.g., # S) and the number of unsatisfied check nodes (e.g., # U).

In one embodiment, an original LLR magnitude may be assigned a value of X, a scale factor may be assigned a value of Q, a symbol value for a bit node may be represented as D, then the soft LLR may be generated as P=# S*Q*D*X−# U*Q*D*X+D*X=(# S*Q−# U*Q+1)*D*X=((# S−# U)*Q+1)*D*X, in which "*" is a multiplication sign. For example, as shown in FIG. 5, four check nodes 502, 504, 508 and 510 may be satisfied, and the check nodes 506 and 512 may be unsatisfied. Accordingly, # S is four (4) and # U is two (2). If the original LLR magnitude X=8, the scaling factor Q=0.5, and the symbol value of the bit node 514 D=+1, the soft LLR P may be generated as P=((4−2)*0.5+1)*8*1=16. In another example, after a symbol-to-check step in one decoding iteration, # S may be one (1) and # U may be five (5). If the original LLR magnitude X=8, the scaling factor Q=0.5, and the symbol value of the bit node 514 D=+1, the soft LLR P may be generated as P=((1−5)*0.5+1)*8*1=−8.

In some embodiments, the soft LLR and any subsequently calculated LLR may have a hardware constraint. For example, the soft LLR and any subsequently calculated LLR may have a finite bandwidth, such as, but not limited to, four (4) bits, five (5) bits, six (6) bits, seven (7) bits or eight (8) bits, and one of the bits may be a sign bit (e.g., the most significant bit (MSB)). The original LLR magnitude X and the scaling factor Q may be selected to satisfy the hardware constraint. For example, the values for X and Q may be any number such that the generated soft LLR value and any subsequently calculated LLR values fall within a value range limited by the finite bandwidth. In addition, in some embodiments, the values for X and Q may be selected such that the generated soft LLR value and any subsequently calculated LLR values not only fall within the value range limited by the finite bandwidth but also cover as large a range as possible. In one embodiment, for example, a binary system with a bit error rate (BER) may have an LLR calculated based on the BER, and the calculated LLR may be scaled to an integer and selected as the original LLR magnitude X. The scaling factor may be determined by simulation.

In one embodiment, for a binary codeword, the symbol value D of the bit node may be either +1 or −1, which may be the original symbol value from the codeword buffer 102, or flipped by the first decoder 104 in an immediate preceding decoding iteration.

In one or more embodiments, the soft LLR generation illustrated in FIG. 5 may be implemented in the soft LLR generator 108. In one embodiment, the soft LLR may be generated after a configurable number of decoding iterations by the first decoder 104. For example, the configurable number may be one, two, three, or the maximum number of iterations configured for the first decoder 104 and the linear block decoder 100 may be configured to use the generated soft LLR as an input for the second decoder 106 regardless of how many decoding operations finally having been performed by the first decoder 104. In another embodiment, the soft LLR may be generated after each decoding iteration by the first decoder 104 and the linear block decoder 100 may be configured to select any one of the generated soft LLR as an input for the second decoder 106 regardless of how many decoding operations finally having been performed by the first decoder 104. In yet another embodiment, the soft LLR generator 108 may be configured to generate soft LLR for several selected iterations, for example, after the first iteration, the third iteration, the fifth iterations, etc., and which iterations to select may be configurable.

Figure 6:
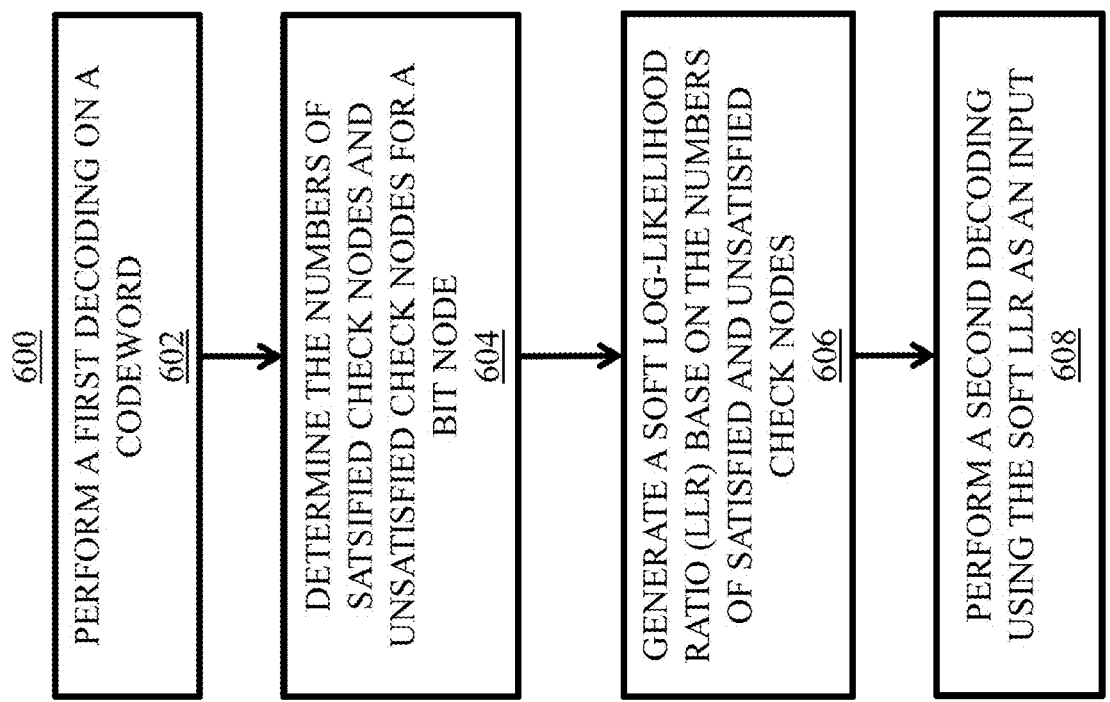
FIG. 6 is a flow diagram of a process for decoding a codeword using generated soft LLR, in accordance with an embodiment of the present disclosure.

FIG. 6 shows a flow chart for a process 600 to decode a linear block codeword according to an embodiment. In block 602, a first decoding may be performed on a codeword. For example, the first decoder 104 may retrieve a codeword from the codeword buffer 102 and perform a first decoding operation on the codeword. In block 604, the numbers of satisfied check nodes and unsatisfied check nodes may be determined for a bit node. For example, after an iteration of the first decoding operation, which may be the first iteration, the second iteration, or any number of iterations, the number of satisfied check nodes and the number of unsatisfied check nodes may be determined for a bit node. In block 606, a soft LLR for a bit node may be generated based on the numbers of satisfied and unsatisfied check nodes. As shown in FIG. 5 and described herein, a soft LLR P for a bit node may be generated based on the numbers of satisfied and unsatisfied check nodes. In block 608, a second decoding may be performed using the soft LLR as an input. For example, the second decoder 106 may use the soft LLR information for a bit node to perform a second decoding operation on a codeword.

The process 600 may be implemented using software (e.g., executable by a computer processor (CPU, GPU, or both)), hardware (e.g., a field-programmable gate array (FPGA) or an application-specific IC (ASIC), firmware, or any suitable combination of the three. In one embodiment, for example, the components of the linear block decoder 100 may be implemented in hardware circuity and the process 600 may be carried on in hardware. In another embodiment, for example, the components of the linear block decoder 100 may be simulated in software and the process 600 may be programmed in computer processor executable instructions and performed by a computer processor executing the executable instructions.

Figure 7:
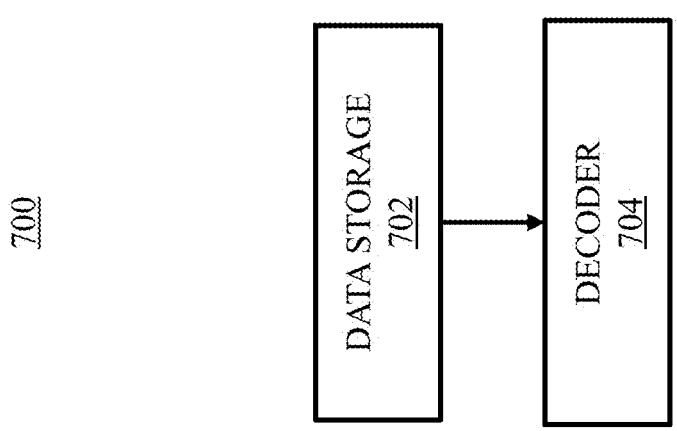
FIG. 7 schematically shows a storage system with error correction in accordance with an embodiment of the present disclosure.

FIG. 7 schematically shows a system 700 comprising the linear block decoder 100 described herein. The system 700 may be a storage system, such as, but not limited to a memory, or a hard drive system. The system 700 may comprise a data storage 702 and a decoder 704. The data storage 702 may be, for example, a memory or a hard drive. The decoder 704 may be an embodiment of the linear block decoder 100 shown in FIG. 1. Data read from the data storage 702 may be corrupt and the decoder 704 may decode the corrupt data and recover the correct data information.

Figure 8:
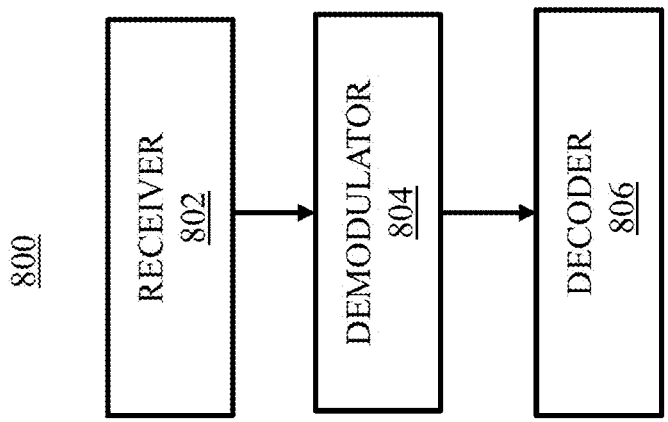
FIG. 8 schematically shows a communication system with error correction in accordance with an embodiment of the present disclosure.

FIG. 8 schematically shows another system 800 comprising the linear block decoder 100 described herein. The system 800 may be a communication system, such as, but not limited to a wired or wireless communication system. The system 800 may comprise a receiver 802, a demodulator 804 and a decoder 806. The receiver 802 may be, for example, an antenna for a wireless communication or a receiver in a wired communication. The demodulator 804 may be configured to demodulate the signals received by the receiver 802 and generate digital signals. The decoder 806 may be an embodiment of the linear block decoder 100 shown in FIG. 1. Data received by the receiver 802 may be corrupt and the decoder 806 may decode the corrupt data and recover the correct data information.

Any of the disclosed methods and operations can be implemented as computer-executable instructions (e.g., software simulation of the linear block decoder 100) stored on one or more computer-readable storage media (e.g., non-transitory computer-readable media, such as one or more optical media discs, volatile memory components (such as DRAM or SRAM), or nonvolatile memory components (such as hard drives)) and executed on a computer (e.g., any commercially available computer, including smart phones or other mobile devices that include computing hardware). Any of the computer-executable instructions for implementing the disclosed techniques as well as any data created and used during implementation of the disclosed embodiments can be stored on one or more computer-readable media (e.g., non-transitory computer-readable media). The computer-executable instructions can be part of, for example, memory access control or digital signal communication. Such software can be executed, for example, on a single local computing device (e.g., any suitable commercially available computer or mobile device) or in a network environment (e.g., via the Internet, a wide-area network, a local-area network, a client-server network (such as a cloud computing network), or other such network) using one or more network computers.

It should be noted that, in several examples and embodiments, LDPC may be used as an example for linear block codes. Embodiments according to the present disclosure, however, may be implemented for other types of linear block codes, such as, but not limited to, rectangular parity and the Hamming code. For example, in one embodiment, the linear block decoder 100 may be implemented for the Hamming code as a Hamming code decoder, and the first decoder 104 and second decoder 106 may implement decoding operations for the Hamming code. Moreover, the word "code" such as used in the "linear block code," "LDPC code" or "Hamming code," may refer to the type of code in general. And the word "codeword" may refer to a unit block of data encoded with a linear block code.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method, comprising:
   performing a first decoding on a codeword using a first decoder;
   determining, for a symbol value of the codeword, a number of satisfied check nodes and a number of unsatisfied check nodes for a decoding result of the first decoding;
   generating a soft log-likelihood ratio (LLR) for the symbol value by multiplying a scaling factor to a difference between the number of satisfied check nodes and the number of unsatisfied check nodes such that a larger difference generating a larger soft LLR value and a smaller difference generating a smaller soft LLR value; and
   performing a second decoding using a second decoder with the soft LLR as an input to the second decoder.

2. The method of claim 1, wherein the first decoding is a hard decision decoding.

3. The method of claim 1, wherein the second decoding is a soft decision decoding.

4. The method of claim 1, wherein the soft LLR for the symbol value is generated according to an equation $P=((\#S-\#U)*Q+1)*D*X$, in which P is the soft LLR to be generated, # S is the number of satisfied check nodes, # U is the number of unsatisfied check nodes, Q is the scaling factor, D is the symbol value, X is an original LLR magnitude assigned to the symbol value, and "*" is a multiplication sign.

5. The method of claim 4, wherein the scaling factor Q and the original LLR magnitude X are selected to satisfy a hardware constraint.

6. The method of claim 1, wherein the first decoding is an iterative decoding.

7. The method of claim 6, wherein the soft LLR is generated after a configurable number of iteration(s) of the first decoding.

8. The method of claim 6, wherein the configurable number is any number between one and a maximum number for iterations.

9. The method of claim 6, wherein the soft LLR is generated after each iteration of the first decoding.

10. The method of claim 9, wherein the soft LLR used as the input to the second decoding is the soft LLR generated after any iteration.

11. The method of claim 1, further comprising adjusting a bit flip threshold during the first decoding.

12. A system, comprising:
   a first decoder comprising circuitry configured to perform a first decoding on a codeword;

a soft log-likelihood ratio (LLR) generator comprising circuitry configured to:
   determine, for a symbol value of the codeword, a number of satisfied check nodes and a number of unsatisfied check nodes for a decoding result of the first decoding; and
   generate a soft log-likelihood ratio (LLR) for the symbol value by multiplying a scaling factor to a difference between the number of satisfied check nodes and the number of unsatisfied check nodes such that a larger difference generating a larger soft LLR value and a smaller difference generating a smaller soft LLR value; and
a second decoder comprising circuitry configured to perform a second decoding using the soft LLR as an input.

13. The system of claim 12, wherein the first decoder is a hard decision decoder and the second decoder is a soft decision decoder.

14. The system of claim 12, wherein the soft LLR generator is configured to generate the soft LLR according to an equation $P=((\#S-\#U)*Q+1)*D*X$, in which P is the soft LLR to be generated, # S is the number of satisfied check nodes, # U is the number of unsatisfied check nodes, Q is the scaling factor, D is the symbol value, X is an original LLR magnitude assigned to the symbol value, and "*" is a multiplication sign.

15. The system of claim 14, wherein the scaling factor Q and the original LLR magnitude X are selected to satisfy a hardware constraint.

16. The system of claim 12, wherein the first decoder is configured to perform an iterative decoding and the soft LLR is generated after a configurable number of iteration(s) of the first decoding, and the configurable number is any number between one and a maximum number for iterations.

17. The system of claim 12, further comprising a data storage, wherein the codeword is read from the data storage.

18. The system of claim 12, further comprising a receiver and a demodulator, wherein the codeword is received from a communication channel via the receiver and demodulated by the demodulator.

* * * * *